US011825755B2

(12) United States Patent
Park et al.

(10) Patent No.: US 11,825,755 B2
(45) Date of Patent: Nov. 21, 2023

(54) NON-VOLATILE MEMORY DEVICE AND METHOD OF FABRICATING THE SAME

(71) Applicants: SK hynix Inc., Icheon (KR); UIF (University Industry Foundation), Yonsei University, Seoul (KR)

(72) Inventors: Woo Young Park, Icheon (KR); Hyunchul Sohn, Seoul (KR); Jinyeol Lee, Seoul (KR); Taeho Kim, Seoul (KR)

(73) Assignees: SK hynix Inc., Icheon (KR); UIF (University Industry Foundation), Yonsei University, Seoul (KR)

( * ) Notice: Subject to any disclaimer, the term of this patent is extended or adjusted under 35 U.S.C. 154(b) by 104 days.

(21) Appl. No.: 17/716,895

(22) Filed: Apr. 8, 2022

(65) Prior Publication Data

US 2022/0231222 A1  Jul. 21, 2022

Related U.S. Application Data

(62) Division of application No. 17/009,560, filed on Sep. 1, 2020, now Pat. No. 11,329,220.

(30) Foreign Application Priority Data

Sep. 3, 2019  (KR) .......................... 10-2019-0108633

(51) Int. Cl.
*H10N 70/20* (2023.01)
*H10B 63/00* (2023.01)
*H10N 70/00* (2023.01)

(52) U.S. Cl.
CPC ............. *H10N 70/24* (2023.02); *H10B 63/00* (2023.02); *H10N 70/021* (2023.02); *H10N 70/826* (2023.02); *H10N 70/8833* (2023.02)

(58) Field of Classification Search
CPC .. H10N 70/24; H10N 70/826; H10N 70/8833; H10B 63/00
See application file for complete search history.

(56) References Cited

U.S. PATENT DOCUMENTS

2011/0186801 A1\* 8/2011 Yang ...................... H10B 63/80
257/4

FOREIGN PATENT DOCUMENTS

KR   101285903 B1   7/2013
KR   101338360 B1   12/2013

OTHER PUBLICATIONS

Hsu et al., "Self-Rectifying Bipolar TaOx/TiO2 RRAM with Superior Endurance over 1012 Cycles for 3D High-Density Storage Class Memory," Symposium on VLSI Technology Digest of Technical Papers, 2013, pp. T166-T167.

\* cited by examiner

*Primary Examiner* — Shih Tsun A Chou (57) ABSTRACT

The present invention relates to a non-volatile memory device and a method of fabricating the same. The non-volatile memory device according to an embodiment of the present invention comprises a first electrode; a second electrode; a first oxide layer disposed between the first electrode and the second electrode, and having a reversible filament formed therein; and an oxygen reservoir layer disposed between the first oxide layer and the second electrode, and absorbing oxygens of the first oxide layer to form oxygen vacancy constituting the reversible filament in the first oxide layer. The concentration of the oxygen vacancy may increase from the first oxide layer toward the oxygen reservoir layer.

10 Claims, 10 Drawing Sheets

NON-VOLATILE MEMORY DEVICE AND METHOD OF FABRICATING THE SAME

CROSS-REFERENCES TO RELATED APPLICATION

The present application is a divisional application of U.S. application Ser. No. 17/009,560 filed Sep. 1, 2020 and claims the benefit of Korean application No. 10-2019-0108633, filed on Sep. 3, 2019, which is herein incorporated by reference in its entirety.

BACKGROUND OF THE INVENTION

1. Field

The present invention relates to a semiconductor memory device, and more particularly, to a non-volatile memory device and a method of fabricating the same.

2. Description of the Related Art

Next-generation memories have been proposed as new non-volatile memory devices to replace a flash memory as a conventional non-volatile memory device. As one of the next generation memories, a resistance change memory RRAM has advantages such as low production cost, simple fabrication process, and fast read/write speed. In addition, the resistance change memory may be fabricated to have an array of cross-point structures, and in this case, a large-capacity memory device having an ultra-high density of 4F2 may be implemented.

In the cross-point structure, the word line and the bit line have a crossing structure to each other. In the cross-point structure, there is a problem of an operation error, for example, a cell cross-talk, such as soft programming of unselected memory cells due to leakage current generated through adjacent memory cells. As a method for solving the operation error, a method for controlling a direction of a current flowing through each memory cell by providing a selection device in each memory cell or a method for varying a resistance of each memory cell according to an applied voltage for turning on/off.

However, when a current direction is controlled by adding a selection device such as a diode or a transistor, it may hinder the improvement of device density, and when turning on/off each memory cell as described above, there is a problem that a range of an operating voltage that may be used for a read operation, a write operation, or an erase operation of the memory device is severely limited depending on a threshold voltage where the resistance of each memory cell is rapidly changing. In order to secure the reliability of the read operation, the write operation, or the erase operation, it is preferable that the range of the operating voltage is enlarged.

SUMMARY OF THE INVENTION

A technological object to be achieved by the present invention is to provide a non-volatile memory device having high reliability without error, and improved integration by securing a sufficient range of operating voltages for a read operation, a write operation or an erase operation even if a selection device is added to prevent signal interference between a selected memory cell and an adjacent unselected memory cell.

In addition, other technological object to be achieved by the present invention is to provide a method of fabricating a non-volatile memory device for easily fabricating a non-volatile memory device having the afore-mentioned advantages.

A non-volatile memory device according to an embodiment of the present invention for solving the above problems comprises a first electrode; a second electrode; a first oxide layer disposed between the first electrode and the second electrode, and having a reversible filament formed therein; and an oxygen reservoir layer disposed between the first oxide layer and the second electrode, and absorbing oxygens of the first oxide layer to form oxygen vacancy constituting the reversible filament in the first oxide layer. The concentration of the oxygen vacancy may increase from the first oxide layer side toward the oxygen reservoir layer side.

In one embodiment, the first oxide layer may include an oxygen vacancy densified layer disposed on a side of oxygen reservoir layer side; and a switching layer disposed on a side of the first electrode and having an oxygen vacancy concentration lower than the oxygen vacancy concentration of the oxygen vacancy densified layer. In other embodiment, the resistance of the non-volatile memory device may be varied depending on the oxygen vacancy concentration of the switching layer.

In one embodiment, the oxygen ions of the first oxide layer move to the oxygen reservoir layer to form the reversible filament in the first oxide layer, and a diameter of the reversible filament may increase from the first electrode toward the oxygen reservoir layer. In another embodiment, oxygen ions of the first oxide layer move to the oxygen reservoir layer to form the reversible filament in the first oxide layer, and the number of reversible filaments may increase from the first electrode toward the oxygen reservoir layer.

In one embodiment, the non-volatile memory device may further include an oxygen ion densified layer between the first oxide layer and the oxygen reservoir layer, and in another embodiment, may further include a second oxide layer having a metal oxide between the second electrode and the oxygen reservoir layer. In yet another embodiment, a metal of the metal oxide may be the same as the metal included in the oxygen reservoir layer In one embodiment, a thickness of the first oxide layer may be in the range of 3 nm to 13 nm. In another embodiment, a thickness of the oxygen reservoir layer may be in the range of 5 nm to 15 nm. In another embodiment, the non-volatile memory device may further include a selection device having resistance switching characteristics between the first electrode and the oxygen reservoir layer or between the second electrode and the first oxide layer A method of fabricating a non-volatile memory device according to an embodiment for solving the above problems may comprise preparing a first electrode; forming a first oxide layer on the first electrode; and forming an oxygen reservoir layer on the first oxide layer and forming a second electrode on the oxygen reservoir layer. In another embodiment, the method of fabricating the non-volatile memory device may further includes forming a second oxide layer on the oxygen reservoir layer, and the second oxide layer may be formed by oxidizing the oxygen reservoir layer via heat treatment.

In one embodiment, the method of fabricating the non-volatile memory device further includes forming a second oxide layer on the oxygen reservoir layer, wherein the second oxide layer may be formed through by applying a heat treatment to the oxygen reservoir layer, and oxidizing the oxygen reservoir layer. In another embodiment, the temperature of the heat treatment may be in the range of 800° C. to 2,000° C.

According to an embodiment of the present invention, since an oxygen reservoir layer having a metal highly reactive with oxygens is formed on a first oxide layer including oxygen vacancy, the oxygens in the first oxide layer move to the oxygen reservoir layer by high reactivity with the metal. Therefore, it is possible to form oxygen vacancy that is distributed throughout the first oxide layer. Accordingly, a volatile memory device may be provided wherein as the size of the set voltage required to form the oxygen vacancy may be increased, the read margin which is the difference between the threshold voltage of the selected element and the set voltage may be improved, there may be no malfunction due to signal interference, and the reliability and density may be improved.

Further, according to an embodiment of the present invention, a method of fabricating a non-volatile memory device capable of easily manufacturing a non-volatile memory device having the above-described advantages by simplifying the processes, and improving yield may be provided.

DETAILED DESCRIPTION OF THE INVENTION

Hereinafter, the preferred embodiments of the present invention will be described in detail with reference to the accompanying drawings.

The embodiments of the present invention are provided to more fully describe the present invention to those having a common knowledge in the related art, and the following embodiments may be modified in various other forms, and the scope of the present invention is not limited to the following embodiments. Rather, these embodiments are provided to make the present invention more clearly and complete, and to fully convey the spirit of the present invention to those skilled in the art.

In addition, in the following drawings, a thickness or a size of each layer is exaggerated for convenience and clarity of description, and the same reference numerals in the drawings refer to the same elements. As used herein, the term, "and/or" includes any one and all combinations of one or more of the listed items.

The terminology used herein is used to describe a specific embodiment and is not intended to limit the present invention. As used herein, a singular form may include plural forms unless the context clearly indicates otherwise. Also, as used herein, the term such as "comprise" and/or "comprising" specifies the mentioned shapes, numbers, steps, actions, members, elements and/or the presence of these groups, and does not exclude the presence or addition of one or more other shapes, numbers, actions, members, elements and/or presence or addition of groups.

Although the terms, such as the first, the second, etc. are used herein to describe various members, components, regions, layers and/or portions, it is obvious that these members, components, regions, layers and/or portions are not defined by these terms. These terms are only used to distinguish one member, component, region, layer or portion from another region, layer or portion. Accordingly, the first member, component, region, layer or portion as described below may refer to the second member, component, region, layer or portion without deporting from the teachings of the present invention.

Hereinafter, embodiments of the present invention will be described with reference to the drawings schematically showing ideal embodiments of the present invention. In the drawings, for example, a size and a shape of members may be exaggerated for convenience and clarity of description, and in actual implementation, modifications of the illustrated shape may be expected. Accordingly, the embodiments of the present invention should not be construed as being limited to the specific shapes of the members or regions shown herein.

Figure 1:
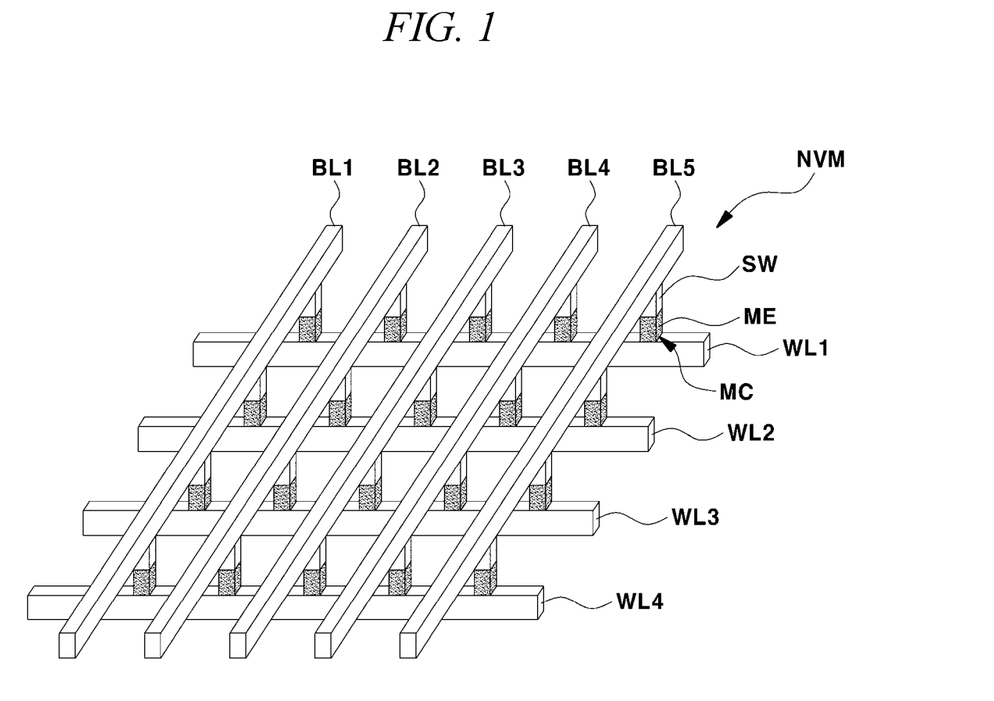
FIG. 1 is a perspective diagram of a non-volatile memory device having a cross point array according to an embodiment of the present invention.

FIG. 1 is a perspective diagram of a non-volatile memory device NVM having a cross point array according to an embodiment of the present invention.

Referring to FIG. 1, the non-volatile memory device NVM may include an array of memory cells MC arranged in a plurality of rows and columns. A set of conductive electrodes (Herein, may be referred to as word lines; WL1 to WL4) extends over one end of the array of memory cells MC. Each word line may be electrically connected to memory cells MC of a corresponding row.

Another set of conductive electrodes (Herein, may be referred to as bit lines; BL1-BL5) may extend over the other end of the array of memory cells MC. Each bit line may be electrically connected to memory cells MC of a corresponding column.

In the non-volatile memory device NVM, each memory cell MC may be disposed at the intersection of one word line and one bit line. A read operation and a write operation of a specific memory cell MC (referred to as a selected memory cell MC) may be performed by activating the word lines and the bit lines coupled to the selected memory cell MC.

The non-volatile memory device NVM may further include a word line control circuit (not shown) which is coupled to the memory cells MC through each word line, and activates the selected word line for a read operation or a write operation of the selected memory cell MC. In one embodiment, the word line control circuit may include a multiplexer (not shown) for selecting a specific word line among word lines.

The non-volatile memory device NVM may further include a bit line control circuit (not shown) coupled to the memory cells MC through each of the bit lines BL1 to BL5. In one embodiment, the bit line control circuit may include a demultiplexer, a sensing circuit, and an input/output (I/O) pad. The demultiplexer may be configured to selectively couple the sensing circuit to the bit line of the selected memory cell MC.

The word line control circuit and the bit line control circuit may individually access memory cells MC by activating corresponding word lines WL1 and bit lines BL5 coupled to the selected memory cell MC. During the write operation, the word line control circuit may write information to the selected memory cell MC by applying a predetermined voltage to the selected word line WL1. The demultiplexer may activate the selected memory cell MC, for example, by grounding the selected memory cell MC. In this case, a logic value may be recorded while a current affecting the characteristics of the memory cell MC is flowing through the selected memory cell MC.

Each memory cell MC may include a variable resistance layer ME for storing information and a selection device SW for selecting the memory cell MC. The selection device SW may also be referred to as a switching element or a steering element. The selection device SW may minimize problems such as signal interference occurring in the non-selection memory cell MC.

The variable resistance layer ME may store a logic value by changing the resistance value. Also, the multi-bit logic values may be stored according to the number of levels of the resistance value. The change in resistance value may be detected through a subsequent read operation.

The memory cell MC may electrically connect the word lines WL1 to WL4 and the bit lines BL1 to BL5. For example, when the memory cell MC is disposed at the intersection of the first word line WL1 and the first bit line BL1, the selection device SW may be electrically connected to the first word line WL1, the variable resistance layer ME may be electrically connected to the first bit line BL1, and the variable resistance layer ME and the selection device SW may be connected in series. Alternatively, when the variable resistance layer ME is disposed on the selection device SW, the variable resistance layer ME may be connected to the first word line WL1, and the selection device SW may be also electrically connected to the first bit line BL1.

During the read operation, the word line control circuit applies a predetermined voltage to the selected word line WL1, and the demultiplexer couples the selected bit line BL5 to the sensing circuit. The logic value of the selected memory cell MC may be detected by the magnitude of the current detected by the sensing circuit, and the resulting value may be transmitted to the I/O pad. A width and/or a magnitude of the voltage pulse across the memory cell MC may be adjusted to program or read the selected memory cell MC, and accordingly, the resistance value of the selected memory cell MC may be adjusted, so that the specific logic states may be read or written.

Figure 2:
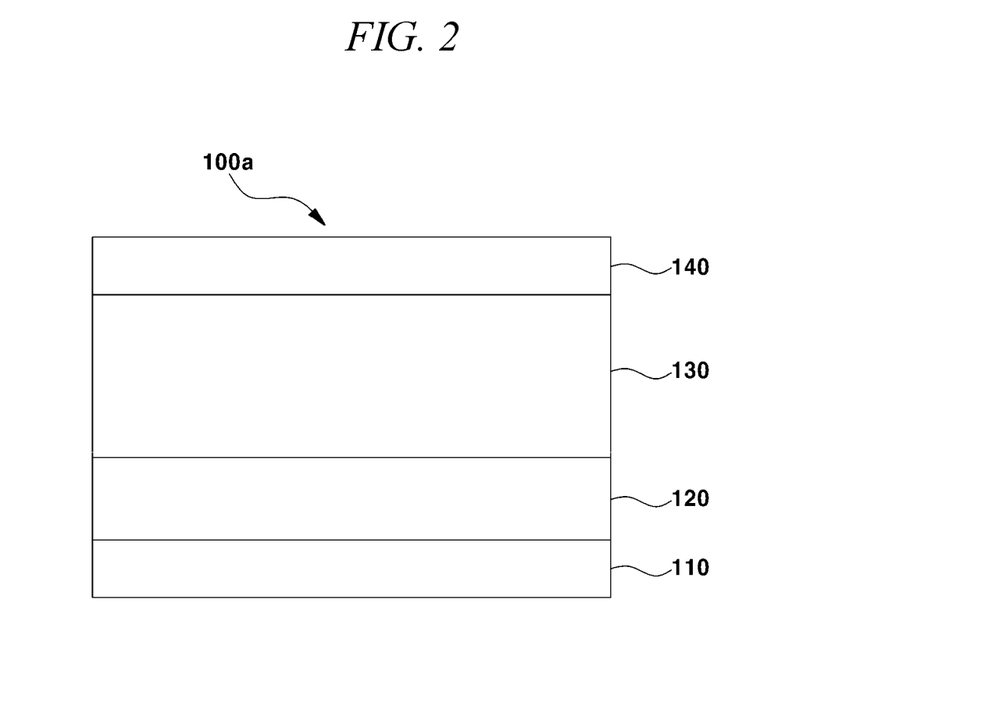
FIG. 2 is a diagram illustrating a non-volatile memory device according to an embodiment of the present invention.

FIG. 2 is a diagram illustrating a non-volatile memory device 100a according to an embodiment of the present invention.

Referring to FIG. 2, in one embodiment, the non-volatile memory device 100a may include a first electrode 110, a second electrode 140, a first oxide layer 120 disposed between the first electrode 110 and the second electrode 140, and an oxygen reservoir layer 130 disposed between the first oxide layer 120 and the second electrode 140. Each of the first electrode 110 and/or the second electrode 140 may be made of metal, conductive metal nitride, conductive metal oxide, or a combination thereof. For example, the first electrode 110 and/or the second electrode 140 may be made of W, WN, Au, Ag, Cu, Al, TiAlN, Ir, Pt, Pd, Ru, Zr, Rh, Ni, Co, Cr, Sn, Zn, ITO, alloys thereof, or a combination thereof. In addition, each of the first electrode 110 and/or the second electrode 140 may include a metal film and a conductive barrier layer covering at least a portion of the metal film. The conductive barrier layer may be made of, for example, Ti, TiN, Ta, TaN, or a combination thereof.

The first oxide layer 120 may be formed of a transition metal oxide. The transition metal oxide may include at least one metal selected from Ta, Zr, Ti, Hf, Mn, Y, Ni, Co, Zn, Nb, Cu, Fe, or Cr. For example, the transition metal oxide may be composed of a single layer or multiple layers formed by of at least one material selected from $Ta_2O_{5-x}$, $ZrO_{2-x}$, $TiO_{2-x}$, $HfO_{2-x}$, $MnO_{2-x}$, $Y_2O_{3-x}$, $NiO_{1-y}$, $Nb_2O_{5-x}$, $CuO_{1-y}$, or $Fe_2O_{3-x}$. In the above illustrated materials, x and y may be selected within the range of $0 \leq x \leq 1.5$ and $0 \leq y \leq 0.5$, respectively, but they are not limited thereto.

A reversible filament for switching a resistance value of the non-volatile memory device 100a may be formed in the first oxide layer 120. Some of the oxygen ions of the oxide of the first oxide layer 120 may be moved by a voltage applied to the non-volatile memory device 100a, and oxygen vacancy (OV of FIG. 4A) may be formed at the site where the oxygen ions leave. Oxygen vacancy OV may be continuously disposed between the first electrode 110 and the second electrode 140 to form a reversible filament, and the reversible filament may be reversibly generated or the at least one part of the reversible filament may be destroyed by the switching of the applied voltage polarity. When the reversible filament forms a continuous conductive path, the resistance value of the first oxide layer 120 is reduced, and when at least one portion of the reversible filament is destroyed, the resistance value of the first oxide layer 120 may increase.

In another embodiment, the first oxide layer 120 may have a multi-layer structure in which two or more layers having different physical properties are stacked. A number or a thickness of the plurality of layers may be freely selected. A barrier layer may be further formed between the plurality of layers. The barrier layer may serve to prevent material diffusion between the plurality of layers. That is, the barrier layer may reduce diffusion of the preceding layer when forming a subsequent one of the plurality of layers.

In one embodiment, the oxygen reservoir layer 130 may absorb or store some of the oxygen ions (OI of FIG. 4A) of the first oxide layer 120. The oxygen reservoir layer 130 may include a metal having high reactivity with oxygen. For example, the metal may include tantalum Ta, titanium Ti, or a combination thereof.

The oxygen reservoir layer 130 having a high reactivity with oxygen absorbs and accommodates the oxygen ions OI of the first oxide layer 120 which may be moved by a voltage applied between the first electrode 110 and the second electrode 140. In the absence of the oxygen reservoir layer 130, the oxygen ions OI move along the flux cross-sectional area corresponding to the cross-sectional area of the filament by the voltage applied between the first electrode 110 and the second electrode 140, but when there is an oxygen reservoir layer 130 according to an embodiment of the present invention, oxygen ions OI may move along a flux cross-sectional area that extends to the entire area of the oxygen reservoir layer 130. For example, when the filament is formed by the application of the voltage, partially or locally thin stranded filaments are formed. But, in an embodiment of the present invention, oxygen ions OI may move simultaneously over the entire area of the first oxide layer 120 to the oxygen reservoir layer 130, and as a whole, form a concentration gradient of oxygen vacancies OV in the first oxide layer 120. According to an embodiment of the present invention, since the oxygen ions OI of the entire region simultaneously move to the oxygen reservoir layer 130 during a set operation, high energy may be required to move the oxygen ions OI. Accordingly, there is an advantage that the read margin which is the difference between the set voltage and the threshold voltage, is improved since the set voltage increases, and a detailed description thereof will be described later with reference to FIGS. 3A and 3B.

In addition, as the magnitude of a reset voltage required during a reset operation is increased, and even when a read voltage of the same polarity as the reset voltage is applied, the read margin may be improved. For the reset operation, at least a portion of the reversible filament composed of oxygen vacancy OV in the first oxide layer 120 must be destroyed. In an embodiment of the present invention, since the oxygen reservoir layer 130 is highly reactive with oxygen, the energy for moving oxygen from the oxygen reservoir layer 130 to the first oxide layer 120 increases in order to destroy at least a portion of the reversible filaments made of oxygen vacancy OV. Accordingly, the magnitude of the reset voltage increases, so that the read margin may be improved.

The concentration of the oxygen vacancy OV may be increased toward the oxygen reservoir layer 130 from the first oxide layer 120. Due to the reactivity of the oxygen reservoir layer 130 with oxygen, the oxygen present in a region close to the oxygen reservoir layer 130 may be more likely to be absorbed into the oxygen reservoir layer 130, as compared with oxygen existing in a region away from the oxygen reservoir layer 130. Therefore, the concentration of oxygen vacancy OV may be higher in an area closer to the oxygen reservoir layer 130 than in an area distant from the oxygen reservoir layer 130. The concentration of the oxygen vacancy OV increases at a constant rate of increase from the first oxide layer 120 side toward the oxygen reservoir layer 130, or initially shows a small increase rate, increases at a high increase rate in the middle, and then, it may be saturated near the oxygen reservoir layer 130. Detailed description of the increase rate will be described later in FIG. 4B.

In one embodiment, the non-volatile memory device 100a may further include a selection device SW having a resistance switching characteristic between the first electrode 110 and the oxygen reservoir layer 130 or between the second electrode 140 and the first oxide layer 120. Alternatively, when the non-volatile memory device 100e described later in FIG. 5A includes the second oxide layer 150, it may be disposed between the second oxide layer 150 and the second electrode 140. As described above, the selection device SW may prevent the leakage current generated in the unselected memory cell from flowing into the selected memory cell and causing an operation error.

Figure 3A:
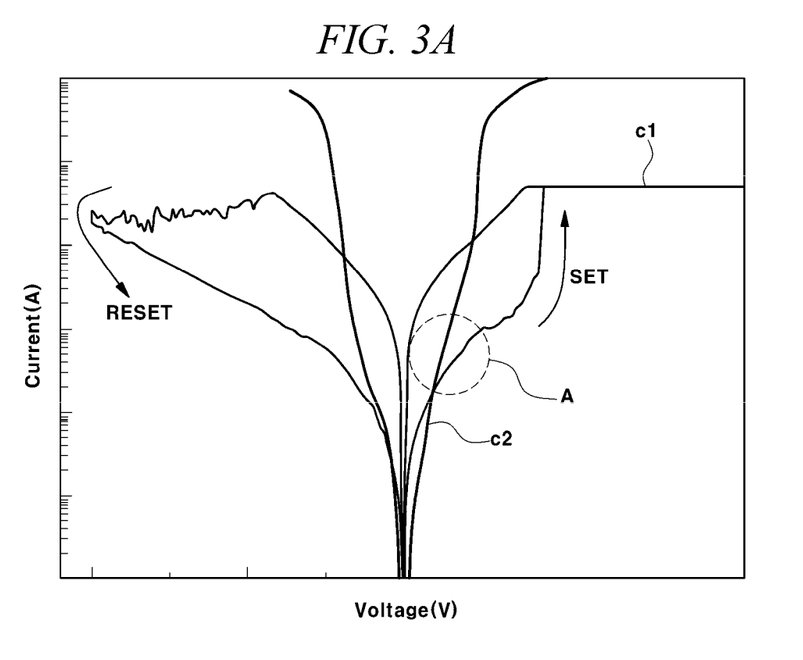
FIG. 3A and FIG. 3B are graphs showing voltage-current curves of a non-volatile memory device according to an embodiment of the present invention.
Figure 3B:
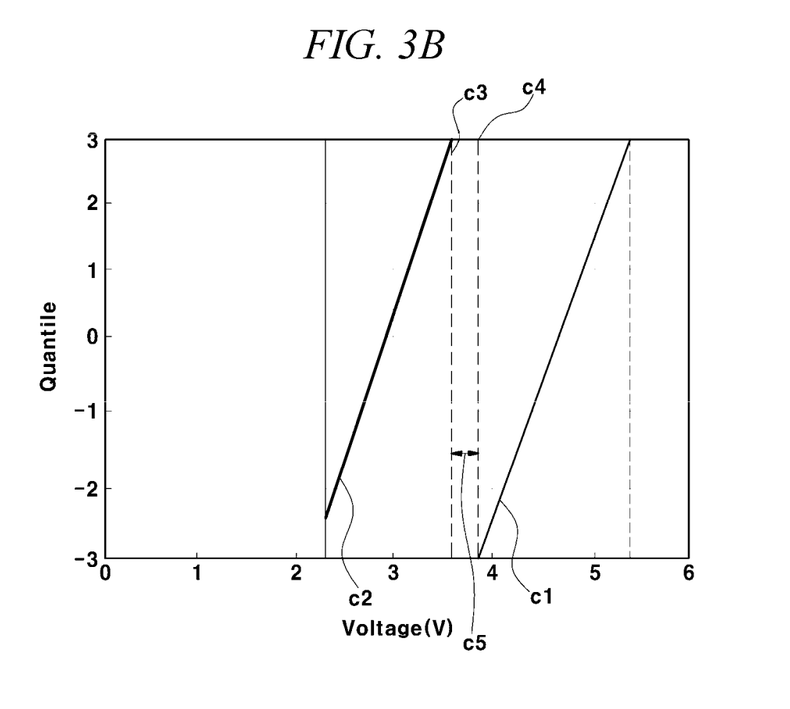

FIG. 3A and FIG. 3B are graphs showing voltage-current curves of a non-volatile memory device according to an embodiment of the present invention.

Referring to FIG. 3A, in one embodiment, the variable resistance layer ME may exhibit resistance change characteristics according to the applied voltage, as indicated by the first curve c1. A non-volatile memory device according to an embodiment of the present invention according to a continuous voltage change based on the voltage sweep exhibits a set switching operation that changes from a high resistance state (HRS) to a low resistance state (LRS), or a reset (RESET) switching characteristic which changes from a low resistance state to a high resistance state. When a predetermined voltage corresponding to a set voltage Vset is applied to both ends of the variable resistance layer ME, continuous oxygen vacancy may be formed in the variable resistance layer ME, and when the oxygen vacancy form a filament, the filament is getting conductive, and provides a path through which the current flows. Thus, the resistance of the variable resistance layer ME may be lowered to have a low resistance state, and the amount of current increases. Conversely, when a voltage corresponding to a reset voltage Vreset is applied to both ends of the variable resistance layer ME, oxygen ions move back into the variable resistance layer ME to destroy at least a portion of the filament, and accordingly, the variable resistance layer ME may be changed to be in a high resistance state.

The leakage current of an unselected cell that causes cell interference may be prevented by a threshold switching characteristics of the selection device SW connected in series to the variable resistance layer ME. As shown by the second curve c2, the selection device SW may have a nonlinear driving characteristic that a current hardly flows when a low voltage is applied, and the magnitude of the current rapidly increases when a voltage higher than a threshold voltage is applied. The material of the selection device SW having the nonlinear driving characteristics may include, as a non-limiting example, niobium oxide ($NbO_x$) or vanadium oxide ($VO_x$) exhibiting a metal-insulator transition phenomenon.

FIG. 3B is an enlarged graph of region A of FIG. 3A, and the y-axis represents a relative magnitude of the current. Referring to FIG. 3B, a voltage greater than a threshold voltage must be applied to the selection device SW to measure the resistance value of the selected memory cell MC and read the logic value. For example, an applicable read voltage applied to read information stored in the memory cell MC may have a value between threshold voltage values indicated by the second curve c2 and set voltage values indicated by the first curve c1.

The first voltage level c3 represents the maximum value among the threshold voltage ranges in which the magnitude of the current of the selection device SW changes rapidly, and the second voltage level c4 indicates the minimum value among the voltage ranges in which the set operation of the non-volatile memory element occurs. The difference in voltage magnitude between the first voltage level c3 and the second voltage level c4 may be defined as a read margin c5. The read margin c5 may represent the narrowest range among the available voltage ranges of the read voltage.

When the size of the read margin c5 is less than a predetermined threshold, a range of a read voltage that may be applied for a read operation of a non-volatile memory device is narrow, and when a read voltage that is greater or less than the range is applied, an operation error may occur. Therefore, reliability of the non-volatile memory device may be deteriorated, and the logic information recorded during the read operation may be changed. Accordingly, in order to read information stored as a resistance value in the selected memory cell MC, a read margin c5 of a predetermined value or more is required. It may be desirable that the second voltage level c4 or the set voltage is increased to improve the read margin c5. According to an embodiment of the present invention, a non-volatile memory device in which operational errors are minimized and high reliability is obtained by improving a read margin c5 may be provided.

Figure 4A:
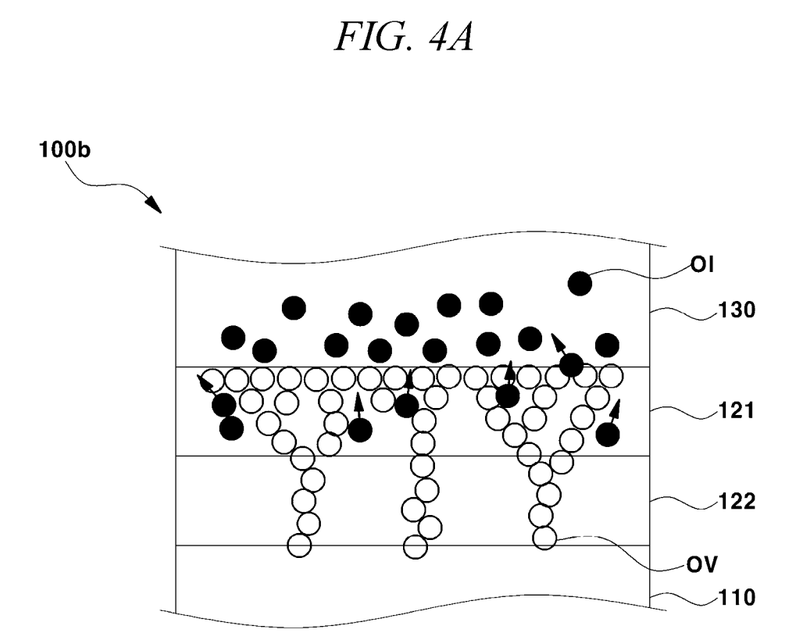
FIG. 4A is a diagram illustrating a non-volatile memory device according to another embodiment of the present invention.
Figure 4B:
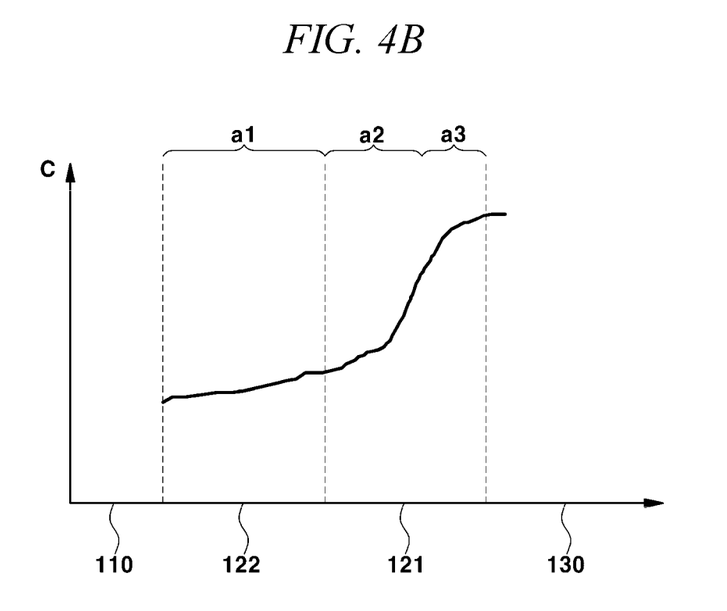
FIG. 4B is a graph showing the concentration of oxygen vacancies in each layer of the non-volatile memory device of FIG. 4A, and FIGS. 4C and 4D are diagrams showing the distribution pattern of an oxygen vacancy filament of a non-volatile memory device according to various embodiments of the present invention.
Figure 4C:
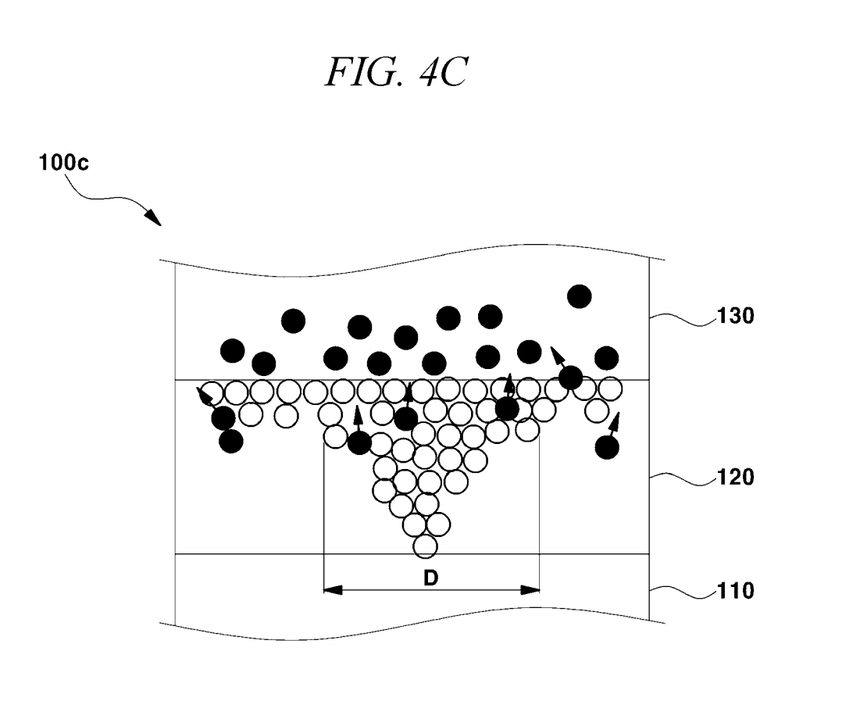
Figure 4D:
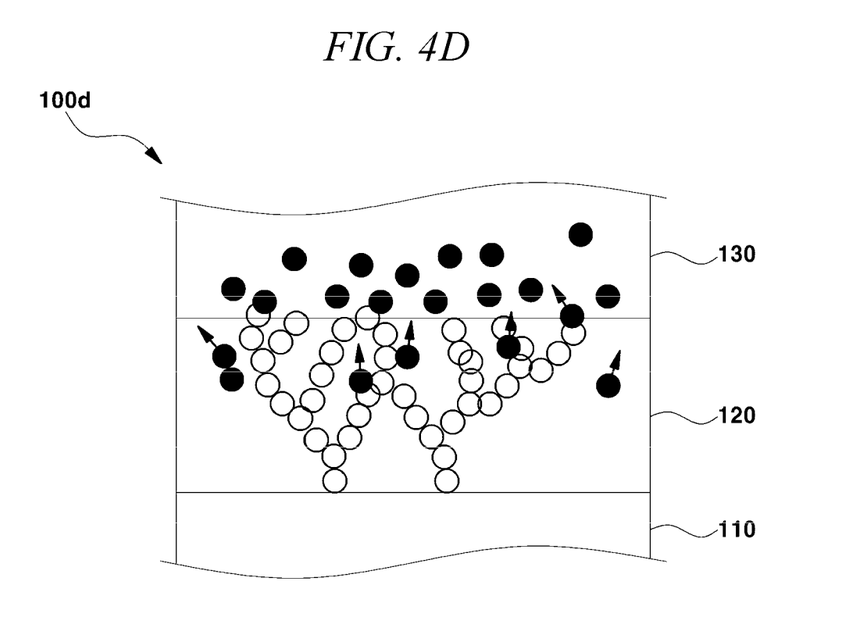

FIG. 4A is a diagram illustrating a non-volatile memory device 100b according to another embodiment of the present invention, FIG. 4B is a graph showing a concentration C of oxygen vacancy OV of each layer of the non-volatile memory device 100b of FIG. 4A. FIG. 4C and FIG. 4D are diagrams illustrating distribution patterns of oxygen vacancy OV filaments of non-volatile memory devices 100c and 100d according to various embodiments of the present disclosure.

Referring to FIG. 4A, in one embodiment, the first oxide layer 120 of the non-volatile memory device 100b may include an oxygen vacancies concentration layer 121 which may be disposed on a side of the oxygen reservoir layer 130 and have a first oxygen vacancies OV concentration, and a switching layer 122 which may be disposed on a side of the first electrode 110 and have a second oxygen vacancy OV concentration. As described above, the concentration of the oxygen vacancies OV is higher in the region close to the oxygen reservoir layer 130, and accordingly, the oxygen vacancies OV concentration of the switching layer 122 may be lower than a concentration of the oxygen vacancies concentration layer 121.

The oxygen vacancy densified layer 121 may be a conductive layer having higher electrical conductivity than the switching layer 122, since in the oxygen vacancy densified layer 121, the oxygen vacancy OV are distributed with a predetermined concentration gradient, and the conductive paths formed by the distributed oxygen vacancy OV are distributed over the entire area and do not take a form of a filament in which oxygen vacancy OV are densely and locally arranged.

On the other hand, in the switching layer 122, thin oxygen vacancy OV filaments are distributed, and the size of the resistance of the entire first oxide layer 120 may be determined according to whether the filament is generated or at least one part thereof is destroyed. The ratio of the switching layer 122 to the total thickness of the first oxide layer 120 may vary depending on factors such as a type of the oxygen reservoir layer 130, a thickness or a driving voltage size of the oxygen reservoir layer 130 and/or the first oxide layer 120.

Referring to FIG. 4B, in one embodiment, in the first oxide layer 120, an increase rate in which the oxygen vacancy OV concentration increases toward the oxygen reservoir layer 130 may not be uniform. For example, the increase rate of the first area a1 corresponding to the switching layer 122 may be lower than the increase rate of the second area a2 included in the oxygen vacancies concentration layer 121. In addition, in the third area a3 close to the oxygen reservoir layer 130 in the oxygen vacancy OV layer, the oxygen vacancy OV concentration may be kept constant or may increase at a lower rate of increase than the rate of the second area a2. This is because there is an equilibrium between the oxygen ions OI absorbed into the oxygen reservoir layer 130 and present in the vicinity of the boundary between the oxygen reservoir layer 130 and the oxygen vacancy densified layer 121; and the oxygen ions moving from the oxygen vacancy densified layer 121 to the oxygen reservoir layer 130. In the first region a1, since the reactivity to move to the oxygen reservoir layer 130 is not large, the concentration of oxygen vacancy OV is low as compared with that of the oxygen vacancy densified layer 121, and thus, the rate of increase of the oxygen vacancy OV concentration may not be large. As the concentration of oxygen vacancies OV in the first region a1 increases or decreases, the resistance of the non-volatile memory device may vary.

According to an embodiment of the present invention, unlike the case in which the generation of the filament or the destruction of a portion thereof occurs in the entire region of the first oxide layer 120, it partially occurs in the switching layer 122. Therefore, since the switching layer has the higher insulation in a high resistance state thereof, there is no leakage current. Consequently, a non-volatile memory device 100b having a current ratio between a high resistance state and a low resistance state, that is, a high on/off ratio may be provided. In addition, the generation of the filament or the destruction of any part thereof proceeds with high uniformity, and there is an advantage that a non-volatile memory device having high reliability without error can be implemented.

Referring to FIG. 4C, in one embodiment, oxygen ions OI of the first oxide layer 120 move to the oxygen reservoir layer 130 to form reversible filaments in the first oxide layer 120, and the diameter (D) of the reversible filament may increase toward the oxygen reservoir layer 130. The oxygen vacancy OV concentration of the first oxide layer 120 increases toward the oxygen reservoir layer 130, and when the oxygen vacancies are densely arranged to form one filament, the filament may be a turned-over conical shape. At least one filament may be included in the first oxide layer 120.

Referring to FIG. 4D, in one embodiment, oxygen ions OI of the first oxide layer 120 move to the oxygen reservoir layer 130 to form reversible filaments in the first oxide layer 120, and the number of reversible filaments may increase from the first electrode 110 toward the oxygen reservoir layer 130. For example, two filaments exist in an area close to the first electrode 110 in the first oxide layer 120, and the number of filaments increases to four as it is getting closer to the oxygen reservoir layer 130. In the region more close to the oxygen reservoir layer 130, the number of filaments increases to 7 or more and thus, a lot of filaments may be present.

Figure 5A:
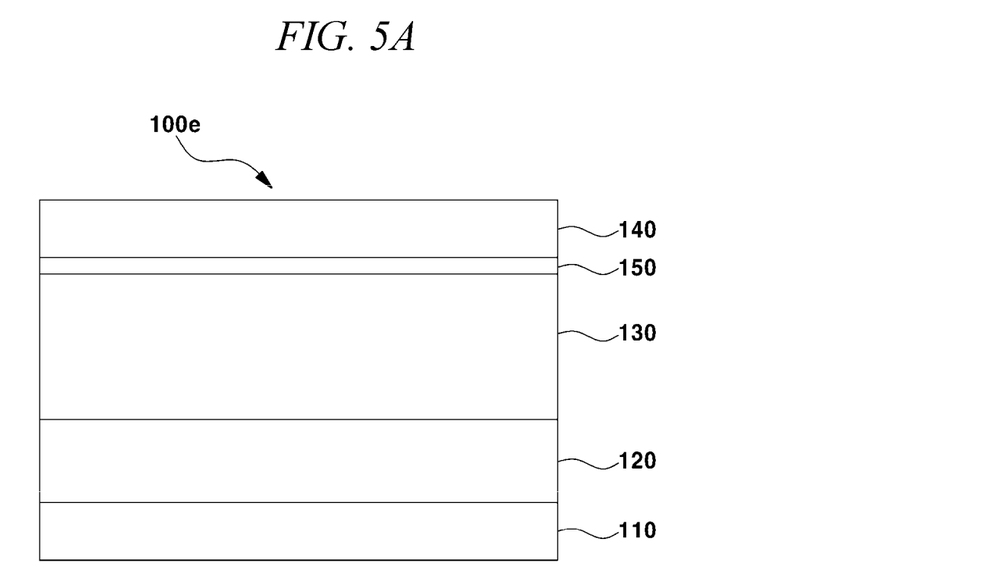
FIG. 5A is a diagram illustrating a non-volatile memory device according to an embodiment of the present invention.
Figure 5B:
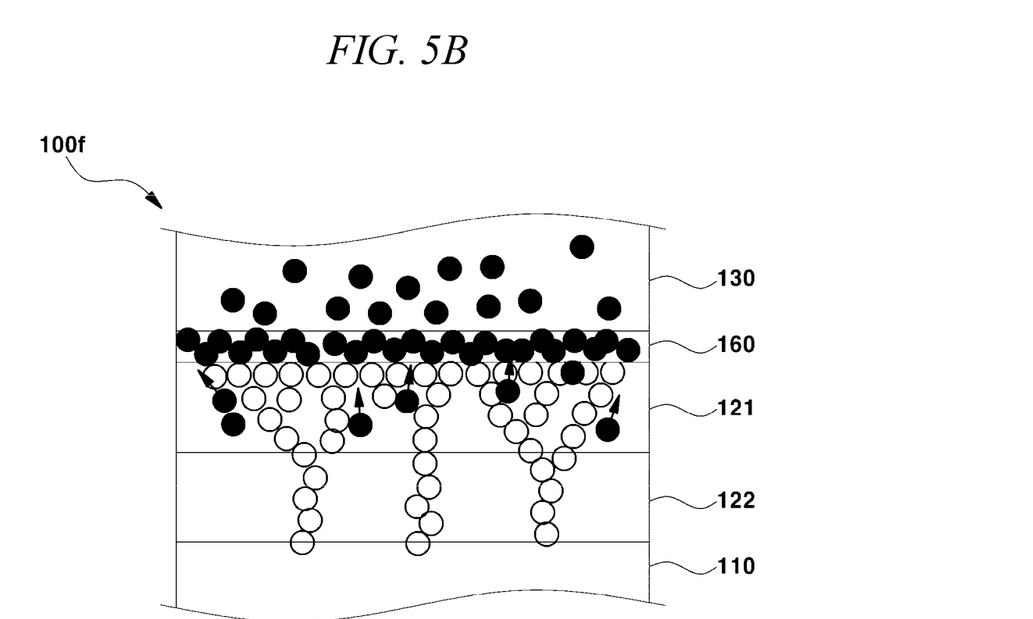
FIG. 5B is a diagram illustrating a non-volatile memory device according to another embodiment of the present invention.

FIG. 5A is a diagram illustrating a non-volatile memory device 100e according to an embodiment of the present invention, and FIG. 5B is a diagram illustrating a non-volatile memory device 100f according to another embodiment of the present invention.

Referring to FIG. 5A, the non-volatile memory device 100e according to an embodiment may further include a second oxide layer 150 having a metal oxide between the second electrode 140 and the oxygen reservoir layer 130. The metal of the metal oxide may be the same metal as the metal included in the oxygen reservoir layer 130. In this case, the second oxide layer 150 has an advantage that may be easily formed without a separate deposition process through a process for oxidizing the oxygen reservoir layer 130. A detailed description thereof will be described later with reference to FIGS. 7A to 7F.

In one embodiment, some of the voltages applied to both ends of the non-volatile memory device 100e may be applied to the second oxide layer 150. The second oxide layer 150 may be a layer having a predetermined internal resistance. Accordingly, the second oxide layer 150 occupies a predetermined ratio of the total voltage applied to both ends of the non-volatile memory device, thereby increasing an operating voltage applied to the entire non-volatile memory device for a set operation or a reset operation. As a result, a read margin may be improved. The thickness of the second oxide layer 150 may be in the range of 1 nm to 10 nm, and may be about 2 nm. The thickness may vary according to factors such as a magnitude of a threshold voltage of the selection device included in the non-volatile memory device, and a thickness or a type of a variable resistance layer ME. In addition, the thickness may be adjusted by controlling the oxidation conditions of the oxygen reservoir layer 130.

In one embodiment, a concentration gradient of oxygen vacancy filament or oxygen vacancies in the second oxide layer 150 may be formed while some of the oxygen ions in the second oxide layer 150 are moving to the second electrode 140 or the oxygen reservoir layer 130. For example, when a positive (+) voltage is applied to the second electrode 140, the oxygen ions may move toward the second electrode 140, and when a voltage of reverse polarity is applied, the oxygen ions may move toward the oxygen reservoir layer 130. Accordingly, the resistance value of the second oxide layer 150 may be changed by formation of a conductive path by the oxygen vacancy filament, or destruction of any part of the conductive path. According to an embodiment of the present invention, movement of oxygen ions occurs not only in the first oxide layer 120 but also in the second oxide layer 130, so that a set voltage or a reset voltage for changing the resistance value of the non-volatile memory device may be increased.

Referring to FIG. 5B, in one embodiment, the non-volatile memory device 100f may further include an oxygen ion densified layer 160 between the first oxide layer 120 and the oxygen reservoir layer 130. The oxygen ion densified layer 160 may be formed by allowing the oxygen ions OI absorbed by the oxygen reservoir layer 130 to be densely arranged between the first oxide layer 120 and the oxygen reservoir layer 130. In another embodiment, the thickness of the oxygen ion densified layer 160 may vary depending on the magnitude of the voltage applied across the non-volatile memory device during the process for forming the initial filament of the non-volatile memory device. For example, as the magnitude of the voltage is getting larger, and the application time of the voltage is getting longer, the thickness of the oxygen ion densified layer 160 may increase.

According to an embodiment of the present invention, as the oxygen ion densified layer 160 is formed, unnecessarily many oxygen ions OI may not move deeply into the oxygen reservoir layer 130 during a set operation. Furthermore, as the oxygen ions OI are concentrated on the interface between the first oxide layer 120 and the oxygen reservoir layer 130, since a process for moving the oxygen ions OI back to the first oxide layer 120 side requires an excessively large driving voltage during a reset operation, unnecessary power consumption may be prevented. Accordingly, since it is possible to increase the set voltage and/or reset voltage to an appropriate level at which unnecessarily excessive power consumption does not occur, a non-volatile memory device having high power efficiency and minimized operation errors may be provided.

Figure 6A:
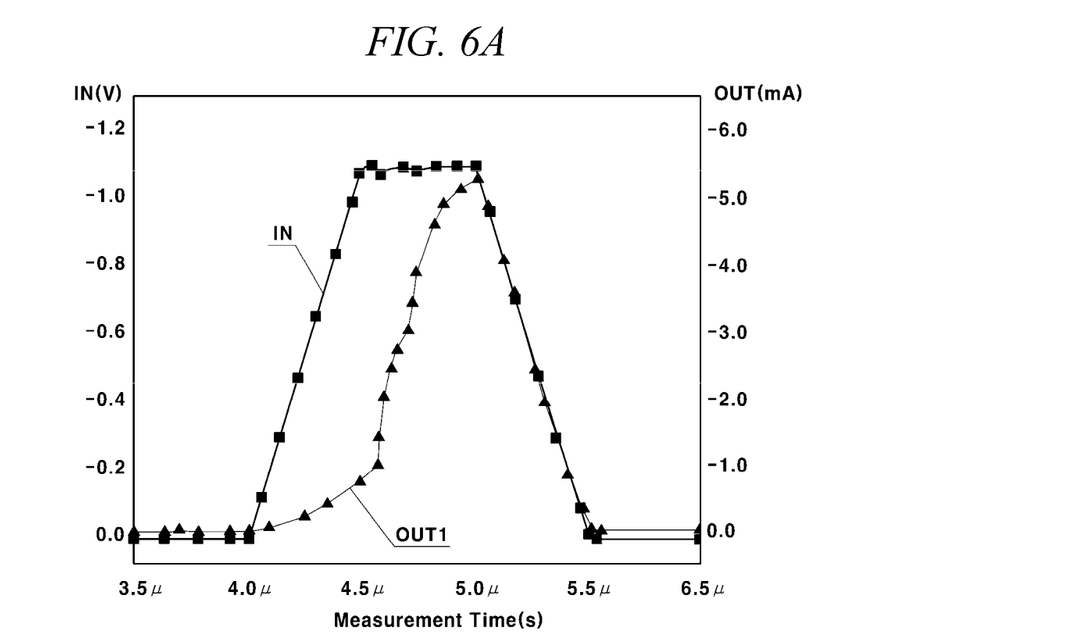
FIG. 6A is a graph showing a voltage-current curve of a non-volatile memory device that does not include an oxygen reservoir layer.
Figure 6B:
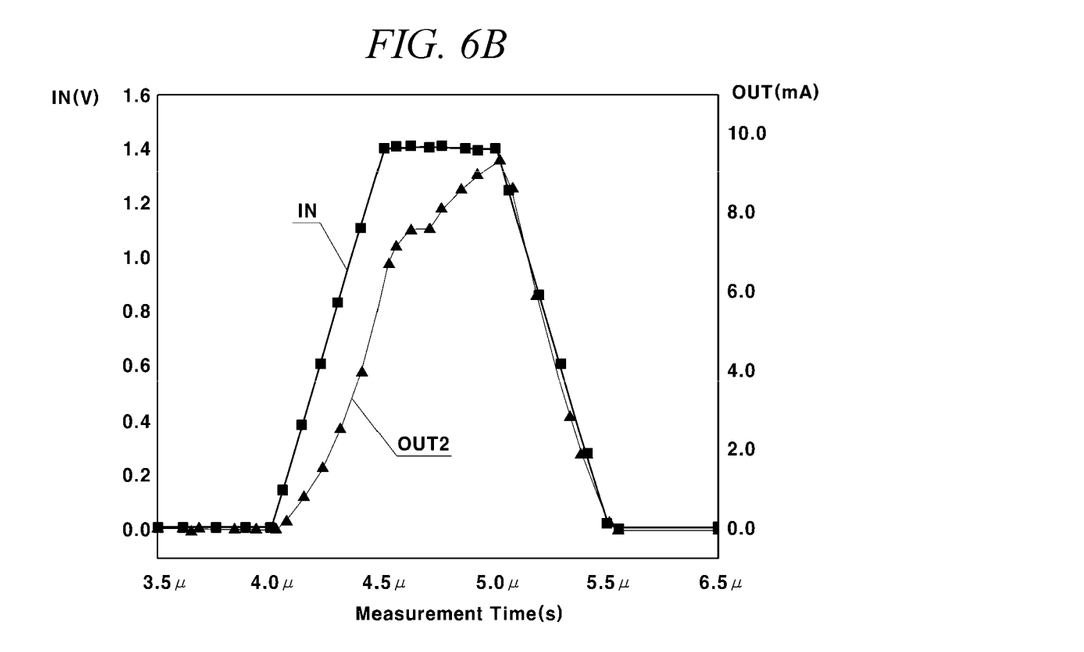
FIG. 6B is graph showing a voltage-current curve of the non-volatile memory devices according to an embodiment of the present invention.

FIG. 6A is a graph showing a voltage-current curve of a non-volatile memory device that does not include an oxygen reservoir layer 130, and FIG. 6B is graph showing a voltage-current curve of the non-volatile memory devices 100a to 100f according to an embodiment of the present invention.

Referring to FIG. 6A, a non-volatile memory device that does not include an oxygen reservoir layer 130 may include a first electrode 110, a second electrode 140, and a first oxide layer 120 arranged between the first electrode 110 ad the second electrode 140. It is a graph measuring the output current OUT1 while changing the driving voltage IN applied to both ends of the non-volatile memory device. It can be seen that the magnitude of the driving voltage IN starts at 0 V and does not increase above 1.1 V. In the section where the magnitude of the driving voltage IN is maintained at about 1.1 V, the output current OUT1 increases. Therefore, it can be seen that the magnitude of the set voltage is 1.1 V. In this case, it can be seen that the increase rate of the current magnitude of the output current OUT1 in FIG. 6A in which the oxygen reservoir layer 130 is not present is higher than the increase rate of the output current OUT2 in FIG. 6B.

Referring to FIG. 6B, a non-volatile memory device according to an embodiment of the present invention includes an oxygen reservoir layer 130. The magnitude of the driving voltage IN may start at 0 V and may not increase above 1.4 V. In addition, it can be seen that the magnitude of the output current OUT2 increases in a section in which the magnitude of the driving voltage IN is 1.4 V, and then decreases as the driving voltage IN decreases. In this case, it can be seen that the rate of increase per unit time of the output current OUT2 is lower than that of FIG. 6A. This is based on the following reasons. Due to the reactivity of the oxygen reservoir layer 130 with high oxygen, a greater number of oxygen ions OI move to the oxygen reservoir layer 130 as compared with a case that the oxygen reservoir layer 130 does not exist. In addition, oxygen ions OI of the first oxide layer 120 does not move in a form of thin oxygen vacancy OV filament, but the oxygen ions OI move simultaneously in the entire region by the oxygen reservoir layer 130. Thus, an oxygen vacancy OV concentration gradient is formed, and accordingly, a lot of electrical energy is required to move oxygen ions OI. According to an embodiment of the present invention, the set voltage may increase from 1.1 V to 1.4 V. Accordingly, the read margin, which is the difference between the threshold voltage and the set voltage, increases, thereby minimizing operating errors.

Referring back to FIG. 2, in one embodiment, the thickness of the first oxide layer 120 may be in the range of 3 nm to 13 nm. When the thickness is less than 3 nm, a leakage current passing through the first oxide layer 120 is likely to occur. When the leakage current occurs, even if there is no oxygen vacancy OV filament, the leakage current flows through the first oxide layer 120, and it is not possible to form a high resistance state. Therefore, a memory characteristic for storing information using the resistance size of the first oxide layer 120 may not appear. When the thickness exceeds 13 nm, as high energy is required in the initial forming process required to exhibit variable resistance characteristics, and the path through which oxygen ions OI must move may be elongated, there is a possibility that the forming process for inducing a conductivity is not appropriately performed.

In one embodiment, the thickness of the oxygen reservoir layer 130 may be in the range of 5 nm to 15 nm. When the thickness is less than 5 nm, it may be difficult to improve a read margin to the extent that the oxygen of the first oxide layer 120 is not sufficiently absorbed to improve the reliability of the non-volatile memory. In addition, since the oxygen reservoir layer 130 is a layer having electrical resistance because it contains a predetermined oxygen due to high reactivity with oxygen, when the oxygen reservoir layer 130 becomes thick so that the thickness exceeds 15 nm, a high foaming voltage may be required, which may lead to useless power consumption, and the reversible filament may not be formed because foaming does not occur properly.

FIG. 7A to FIG. 7F are diagrams illustrating a method of fabricating a non-volatile memory device according to an embodiment of the present invention.

Figure 7A:
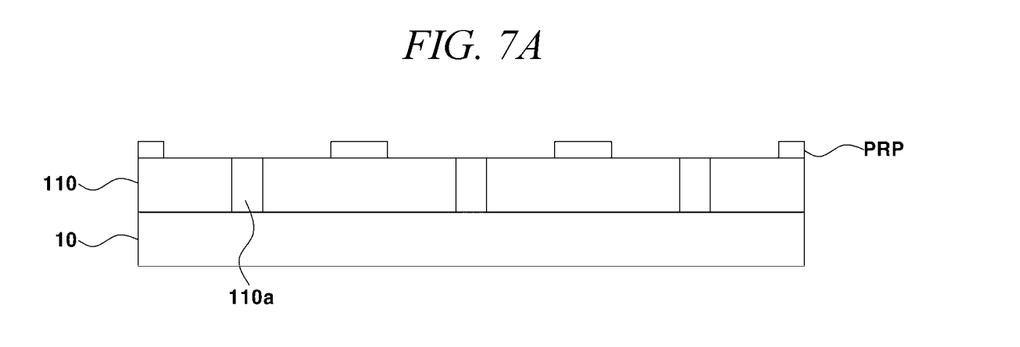
FIG. 7A to FIG. 7F are diagrams illustrating a method of fabricating a non-volatile memory device according to an embodiment of the present invention.

Referring to FIG. 7A, firstly, the first electrode 110 may be formed on the substrate 10. The first electrode 110 may be a plurality of first electrode lines extending in a first direction and spaced apart from each other. The first electrode lines may be formed by an embossing etching process or a damascene process. In addition, the first vias 110*a* electrically connecting the first oxide layer 120 and the first electrode 110 may be formed between the first electrode lines. The first vias 110*a* may be formed by forming a plurality of via holes and filling the via holes with a conductive material such as copper Cu.

Thereafter, a lithography process may be performed to form a photoresist pattern PRP having a predetermined pattern. For example, a photoresist coating may be performed on the first electrode 110, a photomask having a predetermined pattern may be overlaid on the coated photoresist, and then ultraviolet light may be irradiated on the photomask. Therefore, a predetermined pattern may be formed by removing a photoresist that is not covered by the photomask. Optionally, an additional annealing process may be performed after coating the photoresist, and/or after exposing the photoresist to ultraviolet light, and the annealing process may be performed at about 110° C. for 90 seconds.

Figure 7B:
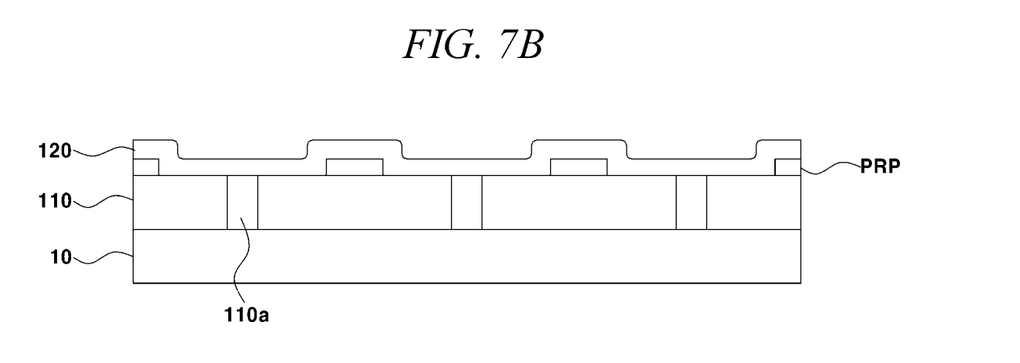
Figure 7C:
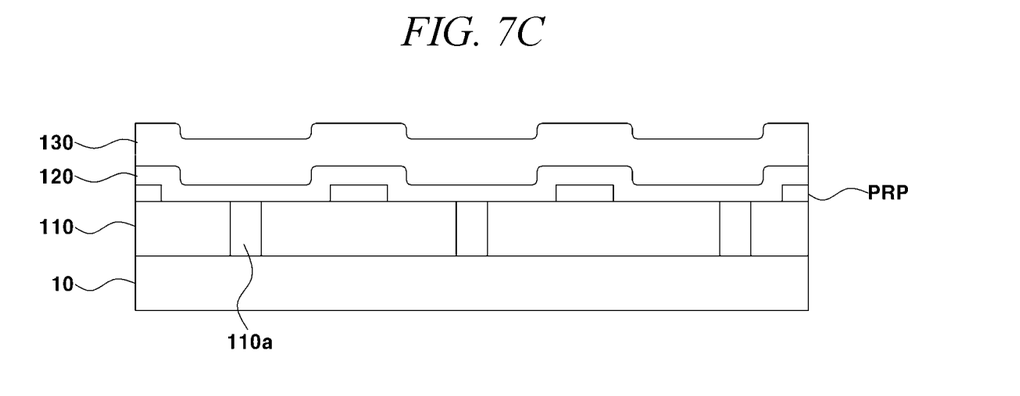

Thereafter, referring to FIGS. 7B and 7C, a first oxide layer 120 and an oxygen reservoir layer 130 may be sequentially formed on the first electrode 110. The first oxide layer 120 and the oxygen reservoir layer 130 may be formed by using a physical vapor deposition, a chemical vapor deposition method, a sputtering method, a pulsed laser deposition method, an evaporation method, an electron beam evaporation method, an atomic layer deposition method, or a molecular beam epitaxy method. A detailed description of the material or function of each material layer constituting the first oxide layer 120 and the oxygen reservoir layer 130 may be understood with referring to the disclosures of FIGS. 2 to 6B.

Figure 7D:
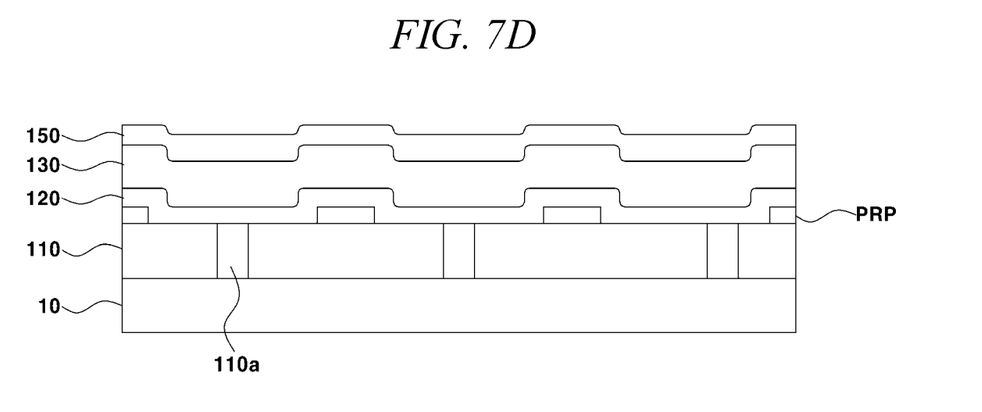

Then, referring to FIG. 7D, a step for forming the second oxide layer 150 may be further included. The second oxide layer 150 may be formed by oxidizing the oxygen reservoir layer 130 through heat treatment. In connection with the heat treatment, the temperature of the heat treatment may be in the range of 800° C. to 2000° C. For example, a predetermined oxidizing agent may be added to proceed the heat treatment at a temperature of about 1000° C. When the temperature is less than 800° C., it may take a long time to oxidize the oxygen reservoir layer 130 for forming the second oxide layer 150 having a sufficient thickness, and thus the process efficiency may decrease. When the temperature exceeds 2000° C., the first electrode 110 or the first oxide layer 120 may be damaged, and the diffusion rate of the impurity may be increased in a semiconductor process in which contamination by impurities may be prevented, which may be undesirable. In addition, when the thickness of the second oxide layer 150 is greater than 10 nm, the set voltage becomes higher than necessary to improve the read margin, and as a result of it, power efficiency may be degraded.

In one embodiment, the heat treatment may be a thermal oxidation process to diffuse into the oxygen reservoir layer 130. The oxidizing agent may be oxygen, and a gas such as hydrogen or nitrogen may be additionally supplied to obtain a quality oxide. According to an embodiment of the present invention, the surface of the oxygen reservoir layer 130 may be modified into the second oxide layer 150 by heat-treating and oxidizing the oxygen reservoir layer 130 without using a separate deposition process for the second oxide layer 150, thereby simplifying the process. Consequently, the non-volatile memory device may be easily formed. In addition, when using the thermal oxidation process, the stability of the electrical properties of the oxide is higher as compared with the deposition process, and a uniform oxide may be obtained, thereby providing a high-performance non-volatile memory device.

In one embodiment, the progress duration of the heat treatment may be in the range of 1 second to 30 seconds. When the progress time is less than 1 second, it is difficult to form an oxide layer having a thickness of several nm, which is the thickness of the second oxide layer 150 necessary for improving the lead margin, and when the progress time exceeds 30 seconds, the thickness of the second oxide layer 150 increases, power efficiency may be lowered as described above. Since a short time is required to form the second oxide layer 150 via the thermal oxidation process, the process time may be shortened. In order to control the set voltage, since the thickness of the second oxide layer 150 may be easily controlled by a method for adjusting the heat treatment time or the heat treatment temperature, the read margin may be improved and a highly reliable non-volatile memory device may be easily implemented.

In one embodiment, the method may further include a step for forming the selection device SW on the oxygen reservoir layer 130 or on the second oxide layer 150. The selection device SW may be germanium Ge, selenium Se, tellurium Te, or a combination thereof, or may include niobium oxide ($NbO_x$) or vanadium oxide ($VO_x$). In another embodiment, the selection device SW may optionally include at least any one selected from the group consisting of boron B, carbon C, nitrogen N, oxygen O, phosphorus P, and sulfur S, as an additive element. For a detailed description of the process for forming the selection device SW, a research member may refer to the disclosure regarding the process for forming the first oxide layer 120 and/or the oxygen reservoir layer 130 disclosed in FIGS. 7B and 7C.

Figure 7E:
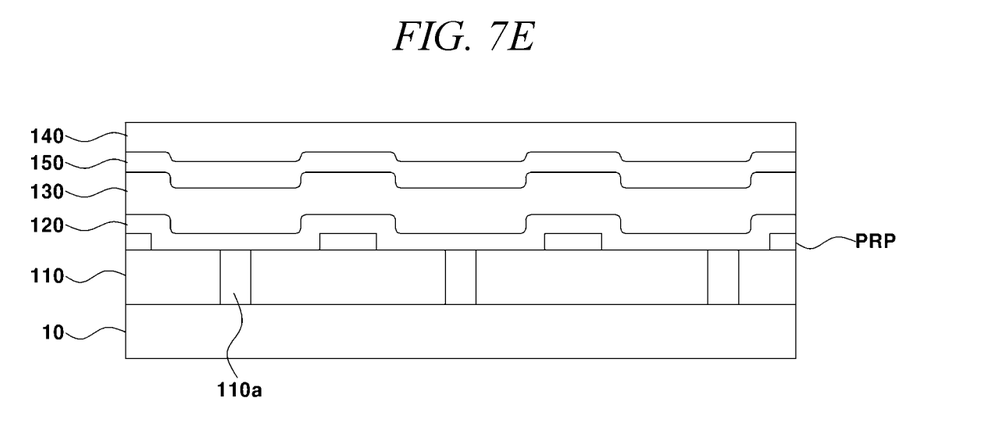

Then, referring to FIG. 7E, a second electrode 140 may be formed on the oxygen reservoir layer 130 or on the second oxide layer 150. The second electrode 140 may be second electrode lines having a predetermined pattern and extending in one direction. The second electrode lines may extend in the second direction and be spaced apart from each other. In another embodiment, the second electrode lines may be formed by an embossing etching process or a damascene process.

Figure 7F:
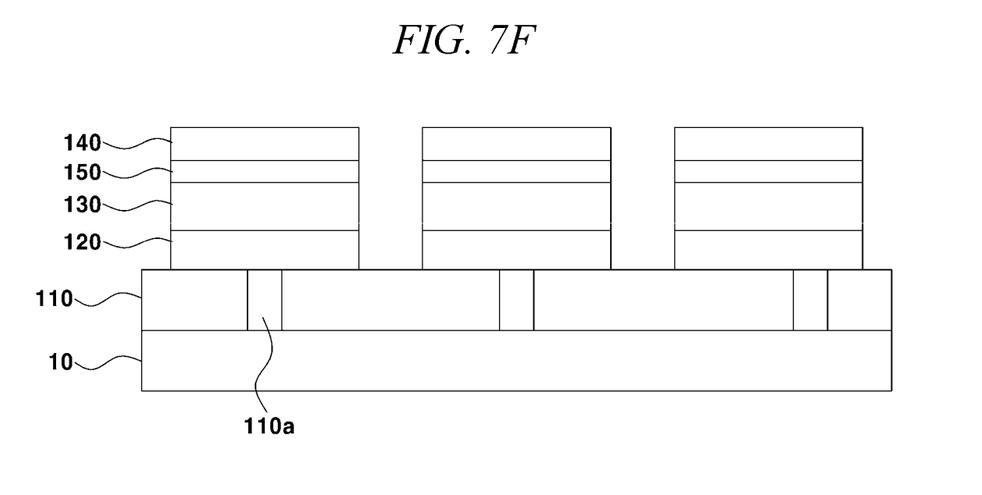

Thereafter, referring to FIG. 7F, the unit memory cell MC may be formed by removing the photoresist pattern PRP to remove the connection portion between the memory cells MC. The photoresist pattern PRP may be removed by a lift-off process. The lift-off process may include a step for removing the photoresist pattern PRP using acetone, not via dry ashing. According to an embodiment of the present invention, since the lift-off process does not require an additional etching process, a low-temperature process is possible, a low-cost manufacturing process is possible, and a process using fewer steps is used as compared with an etching process. Therefore, there is an advantage is that accurate patterning may be implemented.

In one embodiment, before forming the first electrode 110, a step for forming an interlayer insulating layer (not shown) between the substrate 10 and the first electrode 110 may be further included. The interlayer insulating layer may be formed of, for example, silicon oxide or silicon nitride. The interlayer insulating layer may serve to electrically separate the first electrode 110 or the first electrode lines from the substrate 10. Accordingly, a non-volatile memory device having a stacked structure in which a plurality of non-volatile memory devices are stacked through the interlayer insulating layer may be provided.

Figure 8:
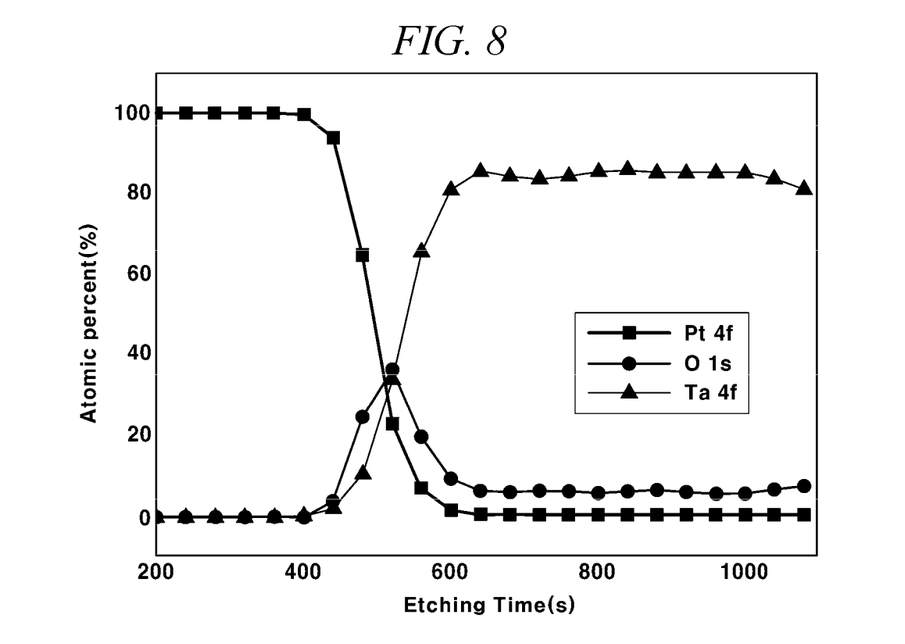
FIG. 8 is a graph illustrating X-ray photoelectron spectroscopy depth profiling of a non-volatile memory device according to an embodiment of the present invention.

FIG. 8 is a graph illustrating X-ray photoelectron spectroscopy depth profiling of a non-volatile memory device according to an embodiment of the present invention.

Referring to FIG. 8, in one embodiment, the x-axis represents an etching time, and as the etching time is getting longer and longer, the region closer to the first electrode 110 is shown. The y-axis represents the proportion of each element. It can be seen that approximately 40% of oxygen atoms exist in the region corresponding to the etching time of 400 seconds to 600 seconds, and thus the second oxide layer 150 may be formed by the thermal oxidation process of the oxygen reservoir layer 130. It can be seen that the first electrode 110 is present in the range of the etching time of 0 seconds to 400 seconds, and the oxygen reservoir layer 130 is formed in the range of the etching time of 600 seconds or more.

Figure 9:
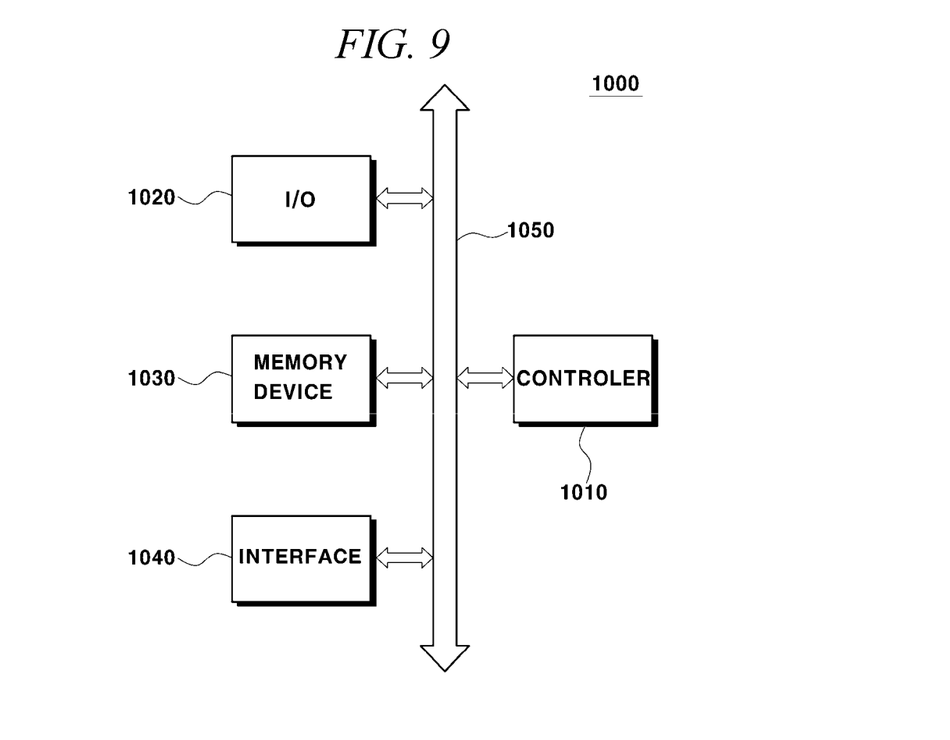
FIG. 9 is a block diagram illustrating an electronic system including a non-volatile memory device according to embodiments of the present invention.

FIG. 9 is a block diagram illustrating an electronic system 1000 including a non-volatile memory device according to embodiments of the present invention.

Referring to FIG. 9, the electronic system 1000 according to an embodiment of the present invention may include a controller 1010, an input/output device (I/O) 1020, a memory device 1030, an interface 1040, and a bus (bus; 1050). The controller 1010, the input/output device 1020, the memory device 1030, and/or the interface 1040 may be coupled to each other through the bus 1050.

The controller 1010 may include at least any one selected from a microprocessor, a digital signal process, a microcontroller, and logic elements capable of performing similar functions. The input/output device 1020 may include a keypad, a keyboard, or a display device. The memory device 1030 may store data and/or instructions, and the memory device 1030 may include a three-dimensional non-volatile memory device disclosed herein.

In one embodiment, the memory device 1030 may have a hybrid structure that further includes other types of semiconductor memory devices (eg, DRAM devices and/or SRAM devices). The interface 1040 may perform a function for transmitting data to a communication network or receiving data from the communication network. The interface 1040 may be wired or wireless.

To this end, the interface 1040 may include an antenna or a wired or wireless transceiver. Although not illustrated, the electronic system 1000 is an operation memory for improving the operation of the controller 1010 and may further include a high-speed DRAM and/or SRAM.

The electronic system 1000 may be applied to a personal digital assistant (PDA) portable computer, a tablet PC, a wireless phone, a mobile phone, and a digital music player, a memory card, or any electronic product capable of transmitting and/or receiving information in a wireless environment.

Figure 10:
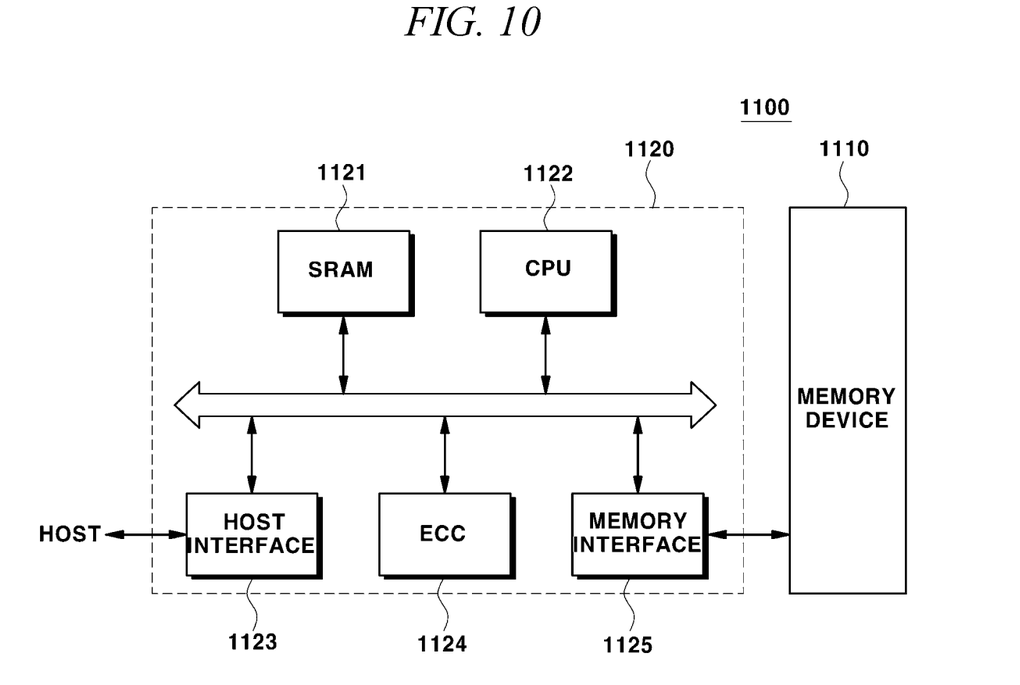
FIG. 10 is a block diagram illustrating a memory card including a non-volatile memory device according to embodiments of the present invention.

FIG. 10 is a block diagram illustrating a memory card 1100 including a non-volatile memory device according to embodiments of the present invention.

Referring to FIG. 10, a memory card 1100 according to an embodiment of the present invention includes a memory device 1110. The memory device 1110 may include at least one of the non-volatile memory elements according to the present invention. Also, the memory device 1110 may further include other types of semiconductor memory devices (eg, DRAM devices and/or SRAM devices). The memory card 1100 may include a memory controller 1120 which controls data exchange between the host and the memory device 1110.

The memory controller 1120 may include a central processing unit CPU 1122 that controls the overall operation of the memory card 1100. The memory controller 1120 may include an SRAM 1121 used as an operating memory of the central processing unit 1122. In addition, the memory controller 1120 may further include a host interface 1123 and a memory interface 1125. The host interface 1123 may include a data exchange protocol between the memory card 1100 and a host. The memory interface 1125 may connect the memory controller 1120 and the memory device 1110. Also, the memory controller 1120 may further include an error correction block (ECC) 1124. The error correction block 1124 may detect and correct errors in data read from the memory device 1110. Although not illustrated, the memory card 1100 may further include a ROM device that stores code data for interfacing with a host. The memory card 1100 may be used as a portable data storage card. The memory card 1100 includes a non-volatile memory device, and may also be implemented as a solid state disk SSD that may replace a hard disk in a computer system.

Although the above-described embodiments are mainly described with respect to a memory device, this is only an example. In addition, it will be understood to a person skilled in the art that a variable resistor according to an embodiment of the present invention may be applied as a fuse and an anti-fuse, or an on/off switching element of a logic circuit such as an FPGA.

The present invention described above is not limited to the above-described embodiments and the accompanying drawings, and it will be apparent to those having a common knowledge in the technological field to which the present invention pertains, that various substitutions, modifications, and changes are possible within the scope of the present invention without departing from the technological concepts.

EXPLANATION OF SYMBOLS

110: first electrode
120: first oxide layer
130: oxygen reservoir layer
140: second electrode
150: second oxide layer
160: oxygen ion densified layer
121: oxygen vacancy densified layer
122: switching layer
OI: oxygen ion,
OV: oxygen vacancy
10: substrate
110a: first vias
PRP: photoresist pattern

What is claimed is:

1. A method of fabricating a non-volatile memory device comprises,
    preparing a first electrode;
    forming a first oxide layer on the first electrode;
    forming an oxygen reservoir layer on the first oxide layer;
    forming a second oxide layer having a metal oxide on the oxygen reservoir layer by oxidizing the oxygen reservoir layer via a heat treatment; and
    forming a second electrode on the second oxide layer.

2. The method of fabricating a non-volatile memory device of the claim 1, wherein a metal of the metal oxide is same as a metal included in the oxygen reservoir layer.

3. The method of fabricating a non-volatile memory device of the claim 1, wherein the oxygen reservoir layer absorbs oxygens of the first oxide layer to form oxygen vacancy constituting reversible filament in the first oxide layer, and wherein the concentration of the oxygen vacancy increases from the first oxide layer toward the oxygen reservoir layer.

4. The method of fabricating a non-volatile memory device of the claim 3, wherein a temperature of the heat treatment is in the range of 800° C. to 2,000° C.

5. The method of fabricating a non-volatile memory device of the claim 1, wherein oxygen ions of the first oxide layer move to the oxygen reservoir layer to form the filament in the first oxide layer, and wherein a diameter of the reversible filament increases from the first electrode toward the oxygen reservoir layer.

6. The method of fabricating a non-volatile memory device of the claim 1, wherein oxygen ions of the first oxide layer move to the oxygen reservoir layer to form the reversible filament in the first oxide layer, and wherein the number of reversible filaments increases from the first electrode toward the oxygen reservoir layer.

7. The method of fabricating a non-volatile memory device of the claim 1, further comprising an oxygen ion densified layer between the first oxide layer and the oxygen reservoir layer.

8. The method of fabricating a non-volatile memory device of the claim 1, wherein a thickness of the first oxide layer is in the range of 3 nm to 13 nm.

9. The method of fabricating a non-volatile memory device of the claim 1, wherein a thickness of the oxygen reservoir layer is in the range of 5 nm to 15 nm.

10. The method of fabricating a non-volatile memory device of the claim 1, further comprising forming a selection device having resistance switching characteristics between the first electrode and the oxygen reservoir layer or between the second electrode and the first oxide layer.

* * * * *